Aug. 29, 1967 B. W. HAKKI 3,339,153
SINGLE PIECE OF BULK SEMICONDUCTOR THAT OSCILLATES, AMPLIFIES AND MIXES
Filed Dec. 27, 1965
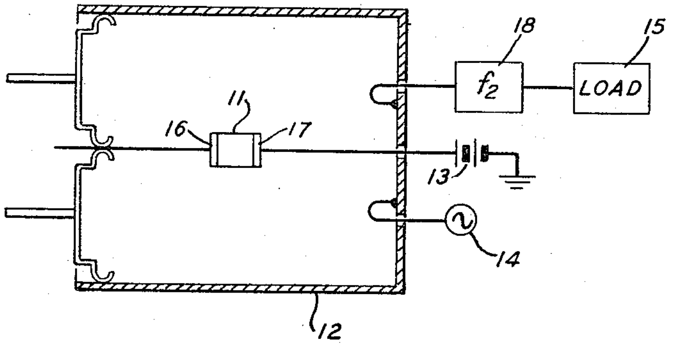
INVENTOR
B. W. HAKKI
BY R. B. Anderson
ATTORNEY United States Patent Office 3,339,153
Patented Aug. 29, 1967

3,339,153
AMPLIFICATION OSCILLATION AND MIXING IN A SINGLE PIECE OF BULK SEMICONDUCTOR
Basil W. Hakki, Scotch Plains, N.J., assignor to Bell Telephone Laboratories, Incorporated, New York, N.Y., a corporation of New York
Filed Dec. 27, 1965, Ser. No. 516,264
6 Claims. (Cl. 331—107)

ABSTRACT OF THE DISCLOSURE

Traveling domain oscillations are excited in a bulk semiconductor diode of the type having the specified relationship of carrier concentration and sample length required for giving stable amplification under low bias voltage conditions. A high frequency input signal applied to the diode mixes with the oscillatory energy to establish a beat frequency which is amplified by the diode.

This invention relates to semiconductor devices, and more particularly, to bulk semiconductor devices wherein a negative bulk differential conductivity arises due to electric field induced carrier transitions to low mobility states.

The evolution, operation, and relevant characteristics of bulk semiconductor devices using field induced transitions are set forth in detail in the copending application of Hakki, Thim, and Uenohara, Ser. No. 465,266, filed June 21, 1965. Briefly, these devices operate on the principle that a negative differential resistance can be formed in certain bulk semiconductor materials that have two energy bands that are separated by an appropriately small energy gap. The bulk material is one of substantially homogeneous constituency without discernible p-n rectifying junctions. A direct current electric field intensity in excess of a certain critical value across the wafer transfers charge carriers from the main lower energy level to the upper energy level where they have a sufficiently lower mobility to establish a differential negative resistance within the bulk material. The possibility of either amplification or oscillation in bulk semiconductors through this mechanism is discussed in the paper "Transferred Electron Amplifiers and Oscillators" by C. Hilsum, Proceedings of the IRE, volume 50, No. 2, page 185, February 1962. In the paper "Instabilities of Current in III–V Semiconductors," by J. B. Gunn, IBM Journal, April 1964, a bulk semiconductor oscillator is described which generates high frequency oscillations in response to an applied pulsed electric field intensity. The Hakki et al. application is directed to a bulk amplifier in which the electric field intensity is maintained at some value below the threshold required for generating spontaneous oscillations. Bulk semiconductor oscillators and amplifiers appear to offer advantages over transistors and junction-type negative resistance semiconductor amplifiers such as higher power capabilities, higher frequencies of operation, and simplicity of structure.

In the course of my study of bulk devices, I have found that amplification is attainable concurrently with the generation of spontaneous oscillations. In accordance with one aspect of my invention, input high frequency energy is applied to a bulk semiconductor wafer that is biased at a voltage substantially higher than that required for the generation of spontaneous oscillations. The applied input mixes with the generated oscillatory energy to establish a difference frequency that is amplified within the wafer. Hence, my device operates as a local oscillator, a mixer, and an amplifier of the generated side band frequency. Since all of these functions are performed within a single wafer of substantially homogeneous constituency, and is operable at microwave frequencies, it can be appreciated that it offers substantial advantages over conventional combinations of devices for performing these functions. The particular frequency and voltage requirements for desired operation will be described later.

These and other objects, features and advantages of the invention will be better appreciated from a consideration of the following detailed description, taken in conjunction with the accompanying drawing which is a schematic diagram of an illustrative embodiment of the invention.

Referring now to the drawing, there is shown schematically an illustrative embodiment of the invention comprising a wafer 11 of bulk semiconductor material mounted within a microwave cavity 12. The wafer 11 is biased by a source 13 at a direct current voltage substantially higher than that required for the generation of self-excited oscillations. The device therefore oscillates at a frequency $f_1$ and, as will be explained later, is additionally capable of amplifying signal energy within a frequency band $\Delta f$. In accordance with one aspect of the invention, input energy from a source 14 at a frequency $f_1+f_2$ is applied across the wafer 11 by the microwave cavity 12. The input energy mixes with the oscillatory energy in the wafer to generate a difference frequency $f_2$ within the frequency band $\Delta f$ which can be amplified concurrently with the generation of the oscillatory frequency $f_1$. The amplified difference frequency is then abstracted from the cavity 12 and transmitted to an appropriate load 15. An appropriate filter arrangement 16 passes only energy at frequency $f_2$. Other filters and circulators may be used to optimize the circuit as is customary in the art.

The wafer 11 is of a known type which is capable of establishing "traveling domain" oscillations. As such, it is made of a bulk homogeneous material having lower and upper energy bands within the conduction band that are separated by only a relatively small energy difference. In appropriate materials such as n-type gallium-arsenide, the carrier concentration is normally greater in the lower energy band than in the upper band and the mobility of the carriers in the lower band exceeds that of the upper band carriers. The electric field intensity across the wafer is applied between contacts 16 and 17 which are substantially ohmic contacts to avoid formation of any strong rectifying junctions.

The applied direct current electric field forms a region of slightly higher resistivity at the negative electrode (in an n-type device) due to a transfer of charge carriers to the higher energy band. Associated with the higher resistivity region is an accumulation of space charge and increased localized electric field intensity referred to as an electric field domain. The domain is fundamentally unstable and once formed, the local carrier distribution and the electric field intensity increase. Simultaneously, the electric field domain moves toward the positive electrode and grows in intensity due to a further transfer of current carriers from the lower to the upper energy band. The lower mobility or higher resistivity of the upper energy band contributes to the cumulative increase of electric field intensity as the domain travels to the positive electrode. Electric fields outside of the moving or traveling domain decrease in intensity so that a new domain cannot be formed at the negative electrode. After the traveling domain reaches the positive electrode the carriers in the upper band fall back to the lower band, the domain is extinguished, and the process is repeated. As a result, oscillatory current flows in the wafer in the form of pulses of a frequency given approximately by:

$$f_1=\frac{v_d}{L} \quad (1)$$

where $v_d$ is the drift velocity of the lower band carriers and L is the length of the wafer between contacts 16 and 17. Under normal conditions, the phase velocity of the traveling domains is equal to the drift velocity $v_d$ in the wafer and Equation 1 is accurate. $f_1$, however, is more accurately defined as the phase velocity $v_\phi$ over the length L or:

$$f_1=\frac{v_\varphi}{L} \quad (2)$$

$v_\phi$ is determinable by a known mathematical statement which, because of its complexity, is omitted.

As is known, the initiation of traveling domain oscillations requires that the wafer 11 have the following characteristics: The two energy bands are separated by a sufficiently small energy level so that population redistribution can take place at field intensities that are not so high as to be destructive to the material; at zero field intensities, the carrier concentration in the lower energy band is more than approximately 100 times that in the upper energy band at the temperature of operation; the mobility of the carriers in the lower energy band ($\mu_1$) is more than approximately five times greater than the mobility in the upper energy band ($\mu_2$). A wafer used in an experimental circuit of the type shown in FIG. 1 was monocrystalline n-type gallium-arsenide whose carrier concentration in the lower energy band was approximately $10^{13}$–$10^{14}$ carriers per cubic centimeter, with a length L between contacts of 45 microns.

The aforementioned Hakki et al. application teaches that a bulk device will display a negative conductance at field intensities that are below the threshold of oscillation, provided that the (carrier concentration) × (sample length) product is less than about $2\times10^{12}$ cm.$^{-2}$. It therefore occurred to me that if the field intensity outside the traveling domains of the oscillating device were sufficiently high, it should be possible to amplify coherent input wave energy concurrently with the generation of oscillations and this was found experimentally to be the case.

A small signal analysis of a wafer having a short sample length yields the following expression for admittance Y, $$Y=\frac{(j\omega+\omega_{d_1}+\gamma\omega_{d_1})\epsilon s_1\left[1+\frac{1}{\omega_c}(j\omega+\omega_{d_1}+\gamma\omega_{d_1})\right]}{1+s_1L-e^{s_1L}+\frac{1}{\omega_c}(j\omega+\omega_{d_1}+\gamma\omega_{d_1})s_1L} \quad (3)$$

where $\omega$ is the signal frequency, $\omega_c$ is the recombination frequency of the carriers at the contacts, $\epsilon$ is the permittivity, $s_1$ is the propagation constant for travelling waves in the wafer. A numerical evaluation of Equation 3 shows that maximum negative conductance occurs at the frequency given by Equation 2 and so oscillation takes place at frequency $f_1$. However, such evaluations also show a range of frequencies $\Delta f$ below $f_1$ at which substantial negative conductance occurs, which can be given approximately by the relationship, $$\tfrac{1}{3}v_\phi/L \lesssim \Delta f \lesssim v_\phi/L \quad (4)$$

With a sufficiently high direct current field intensity, the wafer is therefore capable of amplifying frequencies in the band $\Delta f$.

As mentioned before, amplification requires that the product of carrier concentration and wafer length be less than a certain critical value so that the magnitude of the traveling space-charge wave is restricted in growth to remain below saturation. Restrictions on the operating conditions for amplification can be stated mathematically as, $$\frac{\epsilon 4\pi^2 D_1}{q\mu_1 L} \lesssim -nL(1+\gamma) \lesssim 2.2\frac{\epsilon v_d}{q\mu_1} \quad (5)$$

where $D_1$ is the diffusion constant, $\mu_1$ is the mobility in the lower (000) band, $n$ is the carrier concentration, $\epsilon$ is the dielectric permittivity, and L is the wafer length between contacts. For the specific case of $n$-type gallium-arsenide having a diffusion constant of 400 cm.$^2$/sec., Equation 5 reduces to, $$\frac{2\times10^7}{L} \lesssim -(1+\gamma)nL \lesssim 5.5\times10^{10}\text{ cm.}^{-2} \quad (6)$$

The electric field intensity $E_{sub}$ for giving subthreshold oscillation in a bulk effect device is described in the aforementioned Hakki application. It can also be expressed in terms of the field rate of transfer $\gamma$ of Equation 6 as, $$E_{sub}\approx4\times10^3\left(\frac{-\gamma}{4.5+\gamma}\right)^{0.222} \quad (7)$$

If the oscillatory power output is $P_{10}$ watts, and the length of each domain is $L_D$, then the voltage across the domain is approximately $$V_D\approx\left(\frac{2LL_DP_{10}}{\epsilon v_d A}\right)^{1/2} \quad (8)$$

where $v_d$ is the carrier drift velocity in the lower conduction band, and A is the cross-sectional area of the sample. Hence, the direct current voltage V across the wafer required for maintaining the traveling domain oscillations, together with sufficient field intensity outside of the domains for giving amplification, is the sum of Equations 6 and 7, $$V=LE_{sub}+V_D \quad (9)$$

With a direct current voltage between contacts 16 and 17 sufficient for satisfying Equation 9 spontaneous traveling domain oscillations are generated which will mix with the applied signal energy to establish a beat frequency $f_2$ within the range defined by Equation 4 which is amplified within the wafer in accordance with the invention. Hence, the bulk wafer 11 acts as a local oscillator, a heterodyne mixer, and an amplifier of the beat frequency.

In the described embodiment the input frequency $f_{in}$ is chosen so that $$f_2=f_{in}-f_1 \quad (10)$$

In the experimental version, the 45-micron thick wafer presented a wave phase velocity of $1.6\times10^7$ cm./sec., giving a maximum negative conductance and therefore an oscillation frequency $f_1$ at 3.622 kmc. An input frequency at 6.114 kmc. yielded an amplified difference frequency $f_2$ at 2.492 kmc. Hence, the input frequency was "down-converted." The apparatus could also be used as an "up-converter" if the input frequency is lower than $f_1$ and $f_2$, and if, $$f_2=f_1-f_{in} \quad (11)$$

Of course, $f_2$ must always lie within the amplifiable band $\Delta f_2$. It should be noted that concurrently with the generation of a difference frequency, a sum frequency or upper sideband is generated which could be abstracted by tuning filter 18 to the sum frequency.

The embodiments described are intended to be merely illustrative. Various other modifications and embodiments can be made without departing from the spirit and scope of the invention.

What is claimed is:

1. In combination:

means for generating and amplifying a beat frequency comprising a bulk semiconductive wafer characterized by a capacity for generating traveling domain oscillations through electric field induced carrier transitions to low mobility states when biased at a voltage above a threshold, and when biased at a subthreshold voltage below said threshold voltage, having parameters that substantially conform to the relation, $$\frac{\epsilon 4\pi^2 D_1}{q\mu_1 L} \lesssim -nL(1+\gamma) \lesssim 2.2\frac{\epsilon v_d}{q\mu_1}$$

where $D_1$ is the diffusion constant, $\mu_1$ is the carrier mobility in a lower energy band of the wafer, $n$ is the carrier concentration, $\epsilon$ is the dielectric permittivity, and L is the length of the wafer;

means for producing across the wafer a direct current voltage that is higher than said threshold voltage for initiating spontaneous traveling domain oscillations but insufficient to cause saturation, whereby the wafer simultaneously exhibits negative conductance over a frequency range;

means for applying input wave energy to said wafer, the frequency of the input energy beating with the frequency of the spontaneous oscillations to provide said beat frequency within the range of negative conductance, whereby the beat frequency is amplified;

and means for abstracting for utilization the amplified beat frequency.

2. The combination of claim 1 wherein:

the frequency of the input wave energy with respect to the traveling domain oscillation frequency is appropriate for giving a beat frequency that is within a frequency range $\Delta f$ given by, $$\tfrac{1}{3}v_\phi/L \lesssim \Delta f \lesssim v_\phi/L$$

where $v_\phi$ is the phase velocity of wave energy in the wafer, and L is the length of the wafer between contacts.

3. The combination of claim 2 wherein:

the direct current voltage across the wafer is given by the relation, $$V \approx LE_{sub} + V_D$$

where L is the length of the wafer, $E_{sub}$ is the subthreshold electric field intensity required for giving negative conductance amplification in the wafer and $V_D$ is the voltage across a traveling domain.

4. The combination of claim 3 wherein:

the wafer has upper and lower energy bands with a carrier concentration in the lower energy band at zero field intensity that is more than approximately 100 times that in the upper energy band; and the mobility of the carriers in the lower energy band is more than approximately five times greater than the mobility in the upper energy band.

5. The combination of claim 4 wherein the wafer is gallium-arsenide;

$E_{sub}$ is given by the relation $$E_{sub} \approx 4\times 10^3\left(\frac{-\gamma}{4.5+\gamma}\right)^{0.222}$$

where $\gamma$ is determined by the relation, $$\frac{2\times 10^7}{L} \lesssim -(1+\gamma)nL \lesssim 5.5\times 10^{10}\ \text{cm.}^{-2}$$

6. The combination of claim 5 further comprising:

a load;

and filter means connected between the wafer and the load for transmitting from the wafer to the load only energy at the frequency within the range of negative conductance.

References Cited

J. B. Gunn, IBM Tech. Disclosure Bulletin, "Self-Oscillating Mixer Using GaAs or INP," vol. 8, No. 1, June 1965, p. 32.

ROY LAKE, *Primary Examiner.*

JOHN KOMINSKI, *Examiner.*